(12) United States Patent
Kuulusa et al.

(10) Patent No.: US 9,078,114 B2
(45) Date of Patent: Jul. 7, 2015

(54) MESSAGE TRANSMITTED AUTOMATICALLY IN RESPONSE TO IMMINENT POWER SOURCE DEPLETION OF MOBILE STATION

(71) Applicant: Core Wireless Licensing S.A.R.L., Luxembourg (LU)

(72) Inventors: Mika Kuulusa, Tampere (FI); Juha Kuulusa, Helsinki (FI)

(73) Assignee: Core Wireless Licensing S.a.r.l, Luxembourg (LU)

( * ) Notice: Subject to any disclaimer, the term of this patent is extended or adjusted under 35 U.S.C. 154(b) by 0 days.

(21) Appl. No.: 14/092,095

(22) Filed: Nov. 27, 2013

(65) Prior Publication Data

US 2014/0087706 A1     Mar. 27, 2014

Related U.S. Application Data

(63) Continuation of application No. 12/215,634, filed on Jun. 27, 2008, now Pat. No. 8,611,934.

(51) Int. Cl.
| | |
|---|---|
| *H04W 4/16* | (2009.01) |
| *H04W 4/14* | (2009.01) |
| *H01M 10/48* | (2006.01) |
| *H04W 52/02* | (2009.01) |
| *G01R 31/36* | (2006.01) |
| *H04M 1/725* | (2006.01) |

(52) U.S. Cl.
CPC ............ *H04W 4/16* (2013.01); *G01R 31/3689* (2013.01); *H01M 10/48* (2013.01); *H04M 1/72547* (2013.01); *H04W 52/0261* (2013.01); *H04W 4/14* (2013.01)

(58) Field of Classification Search
CPC ... H01M 10/48; H04W 4/16; H04W 52/0261; H04W 4/14
USPC ................ 455/414.1–414.4, 456.1–457, 466, 455/572–574
See application file for complete search history.

(56) References Cited

U.S. PATENT DOCUMENTS

| | | | |
|---|---|---|---|
| 2003/0119522 A1* | 6/2003 | Barclay et al. ................. | 455/456 |
| 2004/0214613 A1* | 10/2004 | Shin .............................. | 455/567 |
| 2004/0259540 A1 | 12/2004 | Banerjee et al. | |
| 2005/0221808 A1 | 10/2005 | Karlsson et al. | |
| 2006/0121951 A1 | 6/2006 | Perdomo et al. | |
| 2006/0193448 A1* | 8/2006 | Donoghue et al. ........... | 379/67.1 |
| 2008/0056454 A1 | 3/2008 | Lahtiranta et al. | |
| 2008/0311961 A1 | 12/2008 | Cotevino et al. | |
| 2009/0117949 A1 | 5/2009 | Allen, Jr. et al. | |
| 2010/0022224 A1 | 1/2010 | Li | |

FOREIGN PATENT DOCUMENTS

| | | |
|---|---|---|
| EP | 1471361 A2 | 10/2004 |
| KR | 20040051137 A | 6/2004 |
| KR | 20050026207 A | 3/2005 |

* cited by examiner

*Primary Examiner* — Kashif Siddiqui
(74) *Attorney, Agent, or Firm* — Core Wireless Licensing Ltd

(57) ABSTRACT

Described herein are a method, apparatus and computer program to automatically inform a second party to a call that a first party to the call has or will disconnect due to a power source, such as a battery, of a terminal used by the first party becoming depleted. The second party can be informed by the generation and transmission of any suitable type of message, including a SMS message, a MMS message and a IMS message.

21 Claims, 3 Drawing Sheets

MESSAGE TRANSMITTED AUTOMATICALLY IN RESPONSE TO IMMINENT POWER SOURCE DEPLETION OF MOBILE STATION

CROSS-REFERENCE TO RELATED APPLICATIONS

This application is a continuation of U.S. patent application Ser. No. 12/215,634, filed on Jun. 27, 2008. U.S. patent application Ser. No. 12/215,634 is incorporated herein by reference.

TECHNICAL FIELD

The exemplary and non-limiting embodiments of this invention relate generally to wireless communication systems, methods, devices and computer programs and, more specifically, relate to user interfaces and messaging in communication devices having a self-contained power source, such as a battery.

BACKGROUND

Various abbreviations that appear in the specification and/or in the drawing figures are defined as follows:
BS base station
GPS global positioning system
IMS instant message service
MMS multimedia messaging service
MS mobile station
SMS short message service
UI user interface In a typical battery powered communication device, such as a cellular phone, the battery may become fully discharged during a conversation (during a voice call). In many cases this can occur abruptly and results in a shutdown of the device. One problem that arises relates to the fact that the other party or parties to the conversation may have no idea as to why communication ended suddenly with the person (party A) whose phone has shutdown. Assuming that party A does not have ready access to a battery charger, or to a fresh, fully charged battery, then party A cannot call back the other party or parties and reestablish the communication. The other parties to the conversation are left to speculate as to why party A suddenly ended the conversation (e.g., did party A drop his phone, or did he become ill or become involved in an accident, or did his battery die, or did he intentionally hang-up, or did party A exceed some prepaid call time limit?). In many circumstances, such as during a business-related call, the sudden termination of a call for no apparent reason can be less than desirable for all involved parties.

SUMMARY

The foregoing and other problems are overcome, and other advantages are realized, by the use of the exemplary embodiments of this invention.

In a first aspect thereof the exemplary embodiments of this invention provide a method, that includes detecting, during a call, that a power source of a mobile station has or will soon become depleted and automatically sending a message to another party to the call to inform the party that the call was or will be terminated due to the power source becoming depleted.

In another aspect thereof the exemplary embodiments of this invention provide a computer readable memory medium that stores program instructions, the execution of which result in performing operations that comprise detecting, during a call, that a power source of a mobile station has or will soon become depleted; and automatically sending a message to another party to the call to inform the party that the call was or will be terminated due to the power source becoming depleted.

In still another aspect thereof the exemplary embodiments of this invention provide an apparatus that includes means for sourcing power; means for conducting a call with at least one other party via a wireless link; means for detecting, during a call, that said power sourcing means will soon become depleted; and means for automatically sending a message to the at least one other party to inform the at least one other party that the call was or will be terminated due to the power sourcing means becoming depleted.

In yet another aspect thereof the exemplary embodiments of this invention provide an apparatus that includes a power source; a radio frequency transceiver configured to conduct a call with at least one other party; and a controller configured to respond during a call to said power source becoming depleted to automatically send a message to the at least one other party to inform the at least one other party that the call was or will be terminated due to the power source becoming depleted.

DETAILED DESCRIPTION

Figure 1:
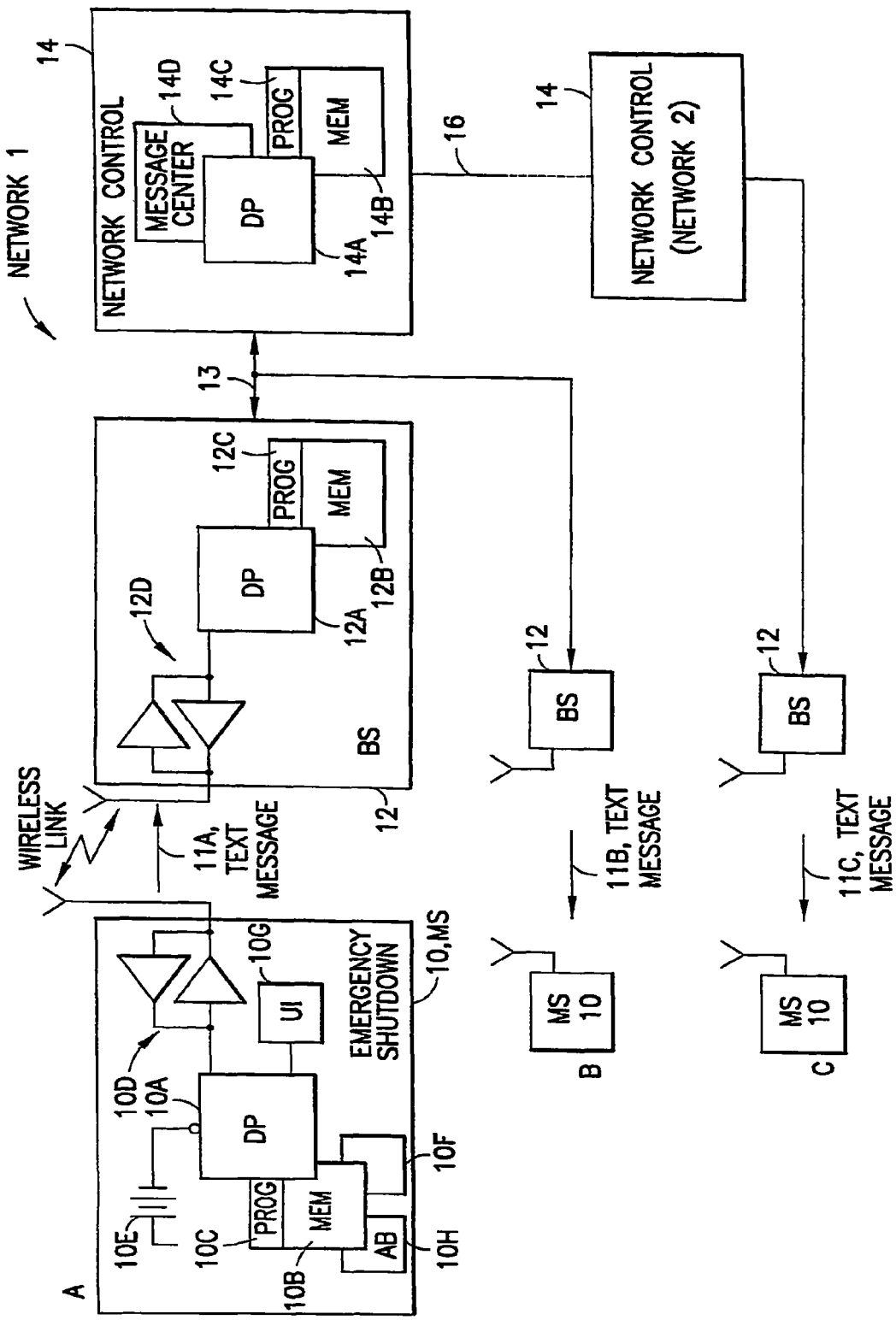
FIG. 1 shows a simplified block diagram of a communication system that is suitable for use in implementing the exemplary embodiments of this invention.

Reference is made to FIG. 1 for illustrating a simplified block diagram of various electronic devices that are suitable for use in practicing the exemplary embodiments of this invention. In FIG. 1 a wireless network 1 is adapted for communication with an apparatus 10, also referred to herein for convenience as a MS 10, via another apparatus, such as a network access node, also referred to herein for convenience as a BS 12. Note that depending on the type of network the MS 10 may be referred to as a user equipment (UE), or as a mobile terminal (MT), or as a mobile node (MN), as a few non-limiting examples. Note as well that depending on the type of network the BS 12 may be referred to as a Node B, or as an evolved Node B (eNB), or as an access point (AP), as a few non-limiting examples. The network 1 typically includes at least one network infrastructure control element 14 that manages a plurality of BSs 12 and that connects directly or indirectly with a telecommunications network 16. The MS 10 includes a controller embodied as at least one data processor (DP) 10A, a memory (MEM) 10B (which may be considered to be a computer-readable memory medium) that stores a program (PROG) 10C, and a suitable radio frequency (RF)

transceiver 10D for bidirectional wireless communications with the BS 12. For the purposes of describing this invention it is assumed that the MS 10 also includes a power source, such as a battery 10E, an emergency shutdown module or subsystem 10F (which may be embodied at least in part by the PROG 10C), and a suitable UI 10G, such as a touch sensitive visual display screen. The BS 12 also includes a DP 12A, a MEM 12B that stores a PROG 12C, and a suitable RF transceiver 12D. The BS 12 is coupled via a data path 13 to the network control element 14 that also includes a DP 14A and a MEM 14B that stores a PROG 14C. Embodied at the network control element 14, or at some other location within the network infrastructure, may be a message center function 14D, such as one adapted for use with SMS messages, MMS messages and/or IMS messages, as non-limiting examples. The network control element can be connected through the telecommunications network 16 to at least one other network control element 14 in another mobile communication network (network 2), as well as with landline phone systems and other types of phone systems, including voice over internet protocol (VoIP) phone systems.

At least the PROG 10C is assumed to include program instructions that, when executed by the associated DP 10A, enable the MS 10 to operate in accordance with the exemplary embodiments of this invention, as will be discussed below in greater detail. In general, the exemplary embodiments of this invention may be implemented at least in part by computer software executable by the DP 10A of the MS 10, or by hardware, or by a combination of software and hardware (and firmware).

The various embodiments of the MS 10 can include, but are not limited to, cellular phones, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, as well as portable units or terminals that incorporate combinations of such functions.

The MEMs 10B, 12B and 14B may be of any type suitable to the local technical environment and may be implemented using any suitable data storage technology, such as semiconductor based memory devices, flash memory, magnetic memory devices and systems, optical memory devices and systems, fixed memory and removable memory. The DPs 10A, 12A and 14A may be of any type suitable to the local technical environment, and may include one or more of general purpose computers, special purpose computers, microprocessors, digital signal processors (DSPs) and processors based on multicore processor architectures, as non-limiting examples.

The emergency shutdown function 10F of the MS 10, upon detecting that the remaining energy in the battery 10E has dropped to a level that indicates that the battery 10E is substantially discharged, begins an orderly shutdown of the MS 10, such as by saving state in a non-volatile portion of the memory 10B and any other desired tasks. In accordance with the exemplary embodiments of this invention the emergency shutdown function 10F also determines if a call is in progress and, if it is, automatically causes a predefined message (e.g., a text message) 11A to be sent to the other party or parties involved in the call. The call then may be automatically terminated, otherwise the call is terminated when the remaining energy level of the battery 10E drops below a value sufficient to support the call operation of the MS 10. In the illustrated example a user of the MS 10 may be considered to be a party A who is conducting a conversation with users of other phones, such as MSs 10, representing parties B and C. The MSs 10 of parties B and C may be in the same or a different wireless network. Of course, one of the parties to the call may be using other than a mobile (wireless) terminal, such as a conventional landline phone.

Figure 2B:
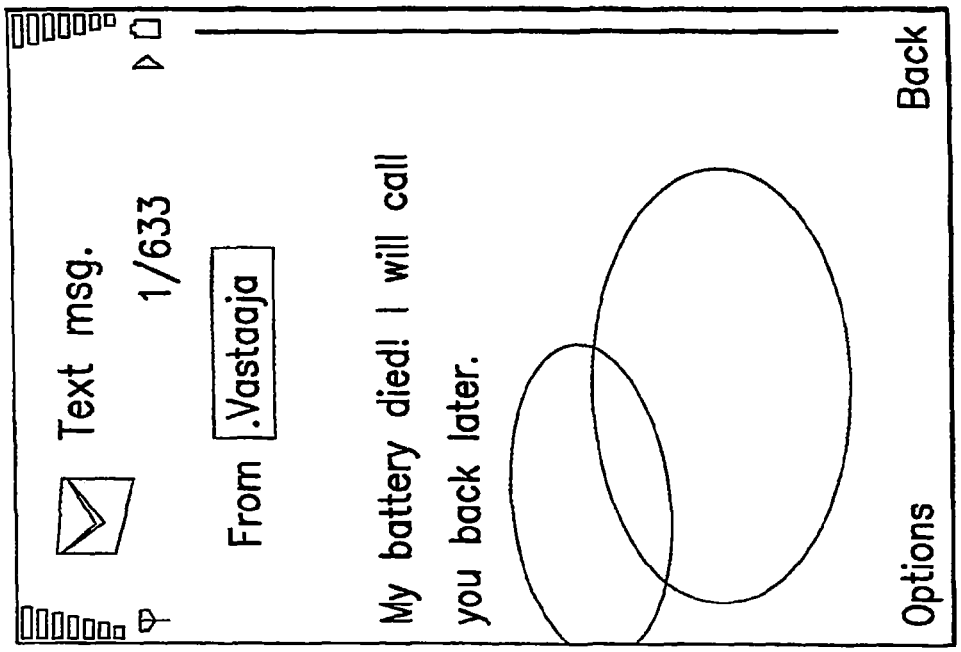
FIGS. 2A and 2B show two exemplary display contents at a party to a conversation that receives a text message from a party whose phone has experienced an emergency shutdown.
Figure 2A:
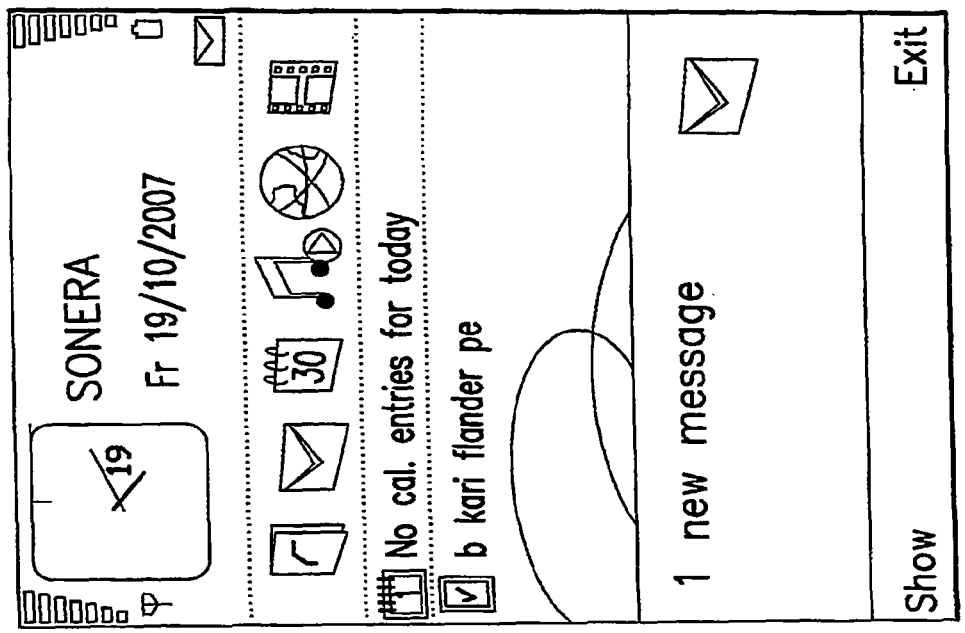

The message 11A may include default text, e.g., "My battery has died, and I will call you back when I can." Alternatively, the MS 10 can include a UI 10G function to enable the user to customize the text string sent as part of the message 11A. In either case the message 11A is handled in a conventional manner by the message center 14D and delivered to the addressed party or parties as text messages 11B and 11C. The result is shown in FIGS. 2A and 2B where, for example, the party B sees a notification on the display of her MS 10 that indicates, e.g., "1 new message", and by opening the new message sees the message text that informs party B that party A was disconnected due to the battery 10E becoming discharged.

It should be noted that the exemplary embodiments of this invention are not limited for use with only SMS messages. For example, other message types, including electronic mail (e-mail) messages, MMS messages, and IMS messages can be employed. As an example, when preparing the message 11A to be sent the emergency shutdown function 10F, and assuming that information exists that identifies the telephone number(s) of the other parties (e.g. B and C), either from the number(s) dialed by the party A or received from the network 1 when an incoming call was received, the emergency shutdown function 10F can lookup information in an address book database/function (AB) 10H of the MS 10 and obtain, for example, an e-mail address associated with the telephone number. In a further embodiment the address book function 10B may be consulted so as to personalize the text message 11A, such as by obtaining a name associated with the number. As an example, the message 11A may be composed to read "Sony Tom, but my battery has died and I will need to call you back." Further, the message 11A may include other than text, for example, a default or user-selected image or video clip may be sent. In another embodiment the message may contain an audio file that can be used to synthesize a speech message to one or both of the parties B and C. In a still further embodiment, and assuming that the MS 10 includes at least one sensor for determining a current context of the MS 10 (e.g., a GPS function, a velocity determining function, etc.) the text message can be customized even further. For example, if the MS 10 senses that the party A is traveling at a velocity indicative of a normal walking speed, and is located somewhere other than a location associated with an office or the home of the party A, and thus most likely does not have access to a battery charger, the message 11A may be composed to read "Sony, but my battery has died and I can't recharge it right now. I will call you back as soon as I can."

In an additional embodiment in accordance with this invention, the MS 10 automatically causes a predefined message 11A to be sent to a network element (e.g., BS 12, network control 14, etc.). The call then may be automatically terminated, otherwise the call is terminated when the remaining energy level of the battery 10E drops below a value sufficient to support the call operation of the MS 10. The network element may then compose and send another message to the other party or parties involved in the call.

It should be appreciated that while described thus far in the context of the battery 10E, the MS 10 can include any type of power source that is susceptible to temporary failure when energy that is stored by, or generated by, the power source falls below some minimum amount needed to support a call (considered herein to be a condition where the power source is depleted). It should further be appreciated that the emergency shutdown function 10F preferably composes and transmits the at least one message 11A just prior to a time that the power source becomes so depleted that it not possible to transmit the message. When the message 11A is transmitted the call may have already been disconnected, or it may be disconnected during transmission of the message 11A, or it may be disconnected after the message 11A is transmitted.

Note that while described for convenience in the context of the emergency shutdown function 10F, the exemplary embodiments of the invention need not form a part of such a function, and may be embodied separately there from as part of some other function, or the exemplary embodiments may be embodied as a dedicated stand-alone function.

Based on the foregoing it should be apparent that the exemplary embodiments of this invention provide a method, apparatus and computer program to automatically inform a second party to a call that a first party to the call has or will disconnect due to a power source of a terminal used by the first party becoming depleted.

Figure 3:
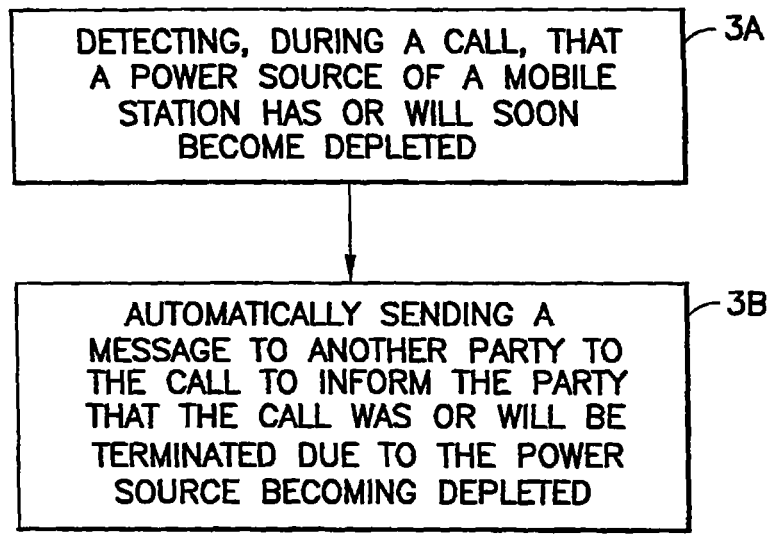
FIG. 3 is a logic flow diagram that illustrates the operation of a method, and a result of execution of computer program instructions, in accordance with the exemplary embodiments of this invention.

Referring to FIG. 3 a method includes, at Block 3A, detecting, during a call, that a power source of a mobile station has or will soon become depleted and, at Block 3B, automatically sending a message to another party to the call to inform the party that the call was or will be terminated due to the power source becoming depleted.

Figure 4:
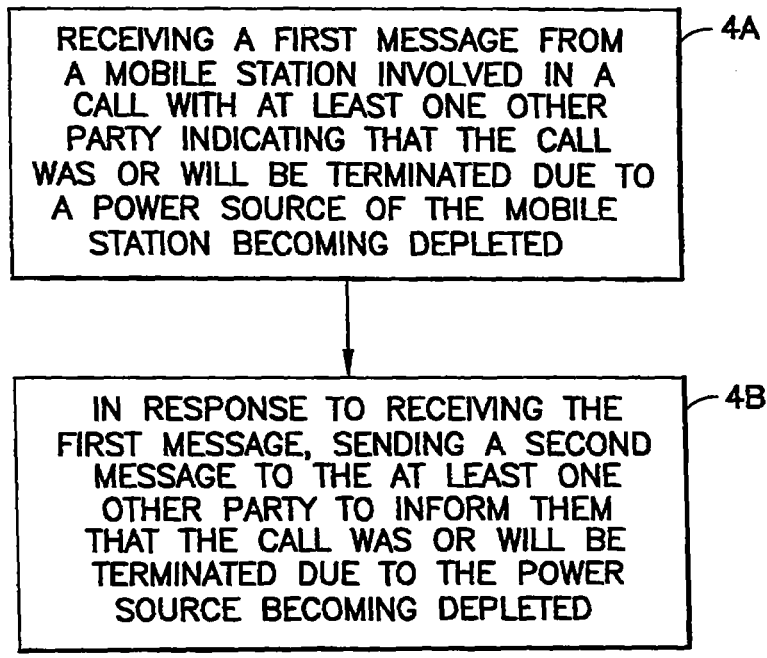
FIG. 4 is a logic flow diagram that illustrates the operation of a method, and a result of execution of computer program instructions, in accordance with the exemplary embodiments of this invention.

Referring to FIG. 4 the method includes, at Block 4A, receiving a first message from a mobile station involved in a call with at least one other party indicating that the call was or will be terminated due to a power source of the mobile station becoming depleted and, at Block 4B, in response to receiving the first message, sending a second message to the at least one other party to inform the at least one other party that the call was or will be terminated due to the power source becoming depleted.

The various blocks shown in FIGS. 3 and 4 may be viewed as method steps, and/or as operations that result from operation of computer program code, and/or as a plurality of coupled logic circuit elements constructed to carry out the associated function(s).

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the exemplary embodiments of this invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

As such, it should be appreciated that at least some aspects of the exemplary embodiments of the inventions may be practiced in various components such as integrated circuit chips and modules. It should thus be appreciated that the exemplary embodiments of this invention may be realized in an apparatus that is embodied as an integrated circuit, where the integrated circuit may comprise circuitry (as well as possibly firmware) for embodying at least one or more of a data processor, a digital signal processor, baseband circuitry and radio frequency circuitry that are configurable so as to operate in accordance with the exemplary embodiments of this invention.

Various modifications and adaptations to the foregoing exemplary embodiments of this invention may become apparent to those skilled in the relevant arts in view of the foregoing description, when read in conjunction with the accompanying drawings. However, any and all modifications will still fall within the scope of the non-limiting and exemplary embodiments of this invention.

For example, the exemplary embodiments of this invention may be used in any type of wireless communication system including, for example, GSM systems, WCDMA systems and evolved UTRAN (universal terrestrial radio access network) systems, as well as future systems including IMT-A (advanced) systems.

It should be noted that the terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements can be physical, logical, or a combination thereof. As employed herein two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Furthermore, some of the features of the various non-limiting and exemplary embodiments of this invention may be used to advantage without the corresponding use of other features. As such, the foregoing description should be considered as merely illustrative of the principles, teachings and exemplary embodiments of this invention, and not in limitation thereof.

What is claimed is:

1. A method, comprising:
   participating, by a communication apparatus, in a call involving an exchange of voice data between a first party and a second party;
   generating, by the communication apparatus, a customized message for the second party, the customized message indicating that the call will terminate due to a power source of the communication apparatus becoming depleted and comprising information based on data obtained by the communication apparatus prior to the establishment of the call; and
   in response to termination of the call, sending the message to the second party.

2. The method of claim 1, wherein the data on which the customized message is based includes a location of the communication apparatus.

3. The method of claim 1, wherein the data on which the customized message is based is specified by the first party.

4. The method of claim 1, wherein the data on which the customized message is based is located in an address book of the communication apparatus.

5. The method of claim 1, wherein the data on which the customized message is based includes a name of the second party stored in an address book of the communication apparatus.

6. The method of claim 1, wherein the data on which the customized message is based is an image or video clip selected by the first party.

7. The method of claim 1, wherein the data on which the customized message is based is obtained from at least one sensor of the communication apparatus.

8. The method of claim 7, wherein the at least one sensor implements at least one of a GPS function or a velocity determining function.

9. The method of claim 1, further comprising accessing information stored by the communication apparatus to determine an email address of the other party to the call, and wherein the message is sent to the other party via the email address.

10. A non-transitory computer readable memory medium that stores program instructions operable when executed to:
   participate in a call involving an exchange of voice data between a first party and a second party;
   generate a customized message for the second party, the customized message indicates that the call will terminate due to a power source of a communication apparatus becoming depleted and comprising information based on data obtained by the communication apparatus prior to the establishment of the call; and
   in response to termination of the call, send the message to the second party.

11. The memory medium of claim 10, wherein the data on which the customized message is based includes a location of the communication apparatus.

12. The memory medium of claim 10, wherein the data on which the customized message is based is specified by the first party.

13. The memory medium of claim 10, wherein the data on which the customized message is based is located in an address book of the communication apparatus.

14. The memory medium of claim 10, wherein the data on which the customized message is based is an image or video clip selected by the first party.

15. The memory medium of claim 10, wherein the data on which the customized message is based is obtained from at least one sensor of the communication apparatus.

16. A communication apparatus, comprising:
   a power source;
   a transceiver configured to conduct a call with at least one other party; and
   a controller configured to:
      participate in a call involving an exchange of voice data between a first party and a second party;
      generate a customized message for the second party, the customized message indicates that the call will terminate due to a power source of the communication apparatus becoming depleted and comprising information based on data obtained by the communication apparatus prior to the establishment of the call; and
      in response to termination of the call, send the message to the second party.

17. The communication apparatus of claim 16, wherein the data on which the customized message is based includes a location of the communication apparatus.

18. The communication apparatus of claim 16, wherein the data on which the customized message is based is specified by the first party.

19. The communication apparatus of claim 16, wherein the data on which the customized message is based is located in an address book of the communication apparatus.

20. The communication apparatus of claim 16, wherein the data on which the customized message is based is an image or video clip selected by the first party.

21. The communication apparatus of claim 16, wherein the data on which the customized message is based is obtained from at least one sensor of the communication apparatus.

* * * * *